United States Patent [19]

Luc

[11] Patent Number: 4,628,150
[45] Date of Patent: Dec. 9, 1986

[54] BONDING AND BONDED PRODUCTS

[75] Inventor: Penelope J. V. Luc, Great Bookham, England

[73] Assignee: Luc Technologies Limited, London, England

[21] Appl. No.: 516,910

[22] Filed: Jul. 25, 1983

[30] Foreign Application Priority Data

Jul. 27, 1982 [GB] United Kingdom ................ 8221702
Jul. 30, 1982 [GB] United Kingdom ................ 8222100

[51] Int. Cl.⁴ ........................ B23K 1/02; B23K 20/12; H01R 43/02
[52] U.S. Cl. ................. 174/88 C; 174/94 R; 361/408; 228/112; 29/828
[58] Field of Search ................. 29/828; 228/110, 111, 228/112, 180.2, 6.2; 174/88 C, 94 R; 361/408

[56] References Cited

U.S. PATENT DOCUMENTS

| | | | |
|---|---|---|---|
| 2,300,517 | 11/1942 | Milton | 29/828 |
| 3,561,107 | 2/1971 | Best et al. | 228/110 X |
| 3,831,262 | 8/1974 | Luc | 228/110 X |
| 3,899,377 | 8/1975 | Luc | 156/73.5 |
| 3,905,537 | 9/1975 | Schmehl | 228/180 A |
| 4,106,167 | 8/1978 | Luc | 228/114 X |
| 4,144,110 | 3/1979 | Luc | 228/112 X |
| 4,295,270 | 10/1981 | Cammarata | 29/828 |
| 4,355,199 | 10/1982 | Luc | 361/400 X |
| 4,480,779 | 11/1984 | Luc | 228/112 |

FOREIGN PATENT DOCUMENTS 1379513 10/1970 United Kingdom .
1380558 10/1970 United Kingdom .
1385473 3/1971 United Kingdom .

Primary Examiner—Kenneth J. Ramsey
Attorney, Agent, or Firm—Kenyon & Kenyon

[57] ABSTRACT

There is disclosed a method of permanently joining conductive electrical components comprising placing portions of the two components in surface to surface contact and passing a rapidly rotating wheel across a surface of one of the portions opposed to the said surface in contact, whereby instantaneously a high energy level is created at the surfaces in contact and a bond is formed between them. Particular importance for the method is in the attachment of flexible conductors to the terminal pads of printed circuit boards. The method can also be used in resoldering components together, and in cable-jointing operations. The electrical components thus bonded together are novel products.

19 Claims, 11 Drawing Figures

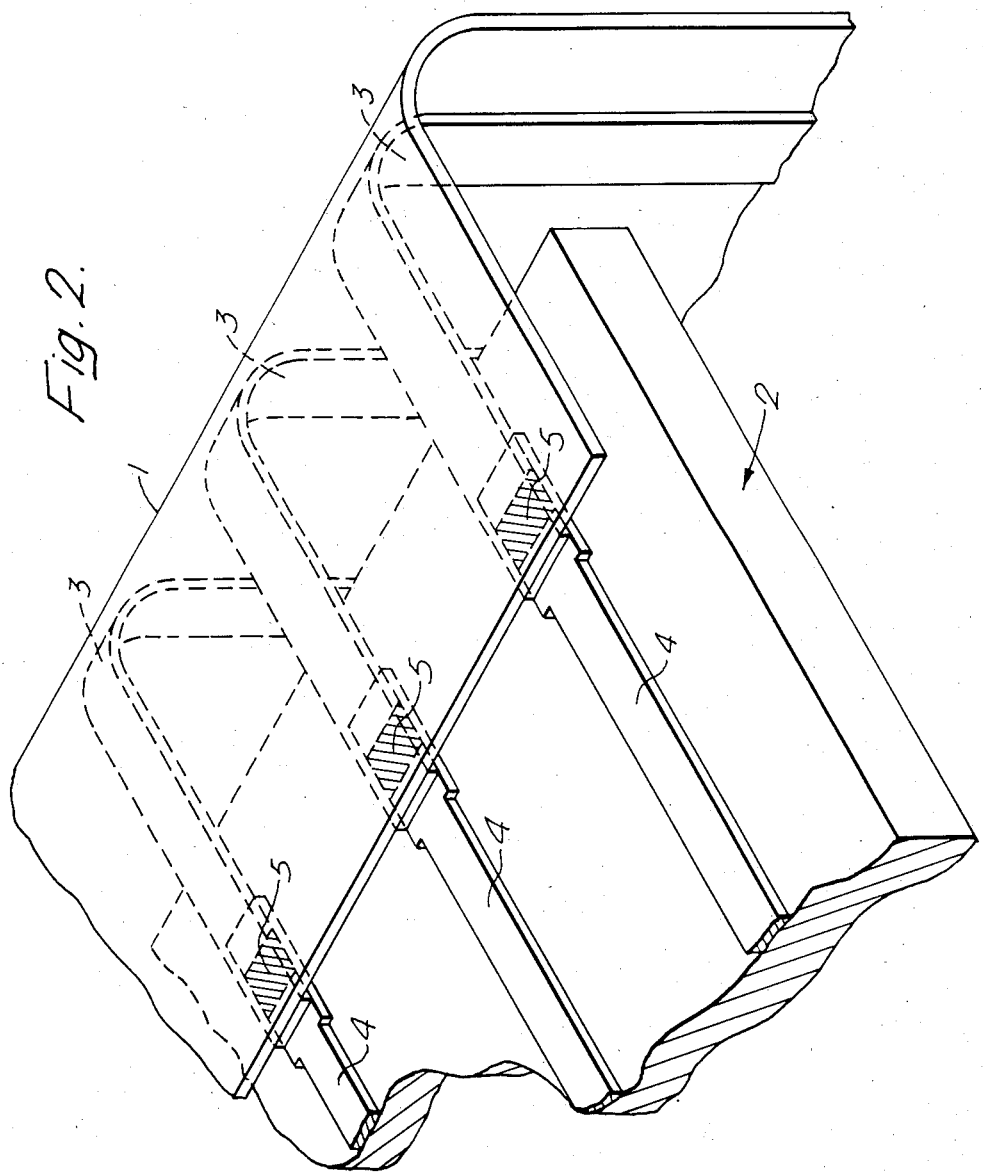

BONDING AND BONDED PRODUCTS

BACKGROUND OF THE INVENTION

This invention relates to novel developments in the process described in our UK Pat. Nos. 1379513, 1380558 and 1385473 to obtain novel joints and end products.

We are concerned in this invention with the problems which arise in the establishment of electrical connections between conductors. At least in certain electrical and electronic fields known methods of forming connections (soldering using heat, mechanical plug-and-socket connections, clamping under pressure) are disadvantageous because they are potentially destructive or are unreliable.

One aspect of the invention concerns making permanent and strong electrically-conductive connections to electric circuit boards. Edge connections or terminal pads of such boards have either been soldered to plug sockets or have been directly mechanically engaged by contact sockets of a flexible conductor strip. Soldering and/or the flux used in soldering can damage the board substrate and/or adjacent elements on the board; mechanical engagement (whether direct or via a plug socket) is unreliable and liable to deteriorate in time.

The present process allows the formation of a permanent, strong, low resistance electrical connection without damage to the board or its pads since neither high pressure nor any sustained high temperature are used.

Any heat generated by the process is of such short duration and so highly localised at the interfaces of the materials to be joined that surrounding or adjacent areas of the components to be joined remain substantially unaffected and the substrates undamaged.

It also allows the soldering of components to a board whether at its edge or at other positions, without damage to the component or the board.

Another important aspect of the invention is forming in-situ welded connections between the outer conductors in cable joints over the cable core.

Most coaxial cables consist of a core conductor surrounded by an insulator which is often a thermoplastic, and which is in turn surrounded by the outer conductor or conductors. A further insulating or protective outer sheath completes the cable. Because of the nature of the inner insulating layer, it is very difficult by conventional means to produce welded or soldered joints in-situ between the outer conductors which do not severely damage the interior cable insulation of the cable at the joint (thereby distorting the cable).

The present process may be used to make permanent low resistance joints between the outer conductors of cables by welding a bridging connection which may be a strap between them without damage to the supporting insulating layers in the cables. The outer cable conductors which are to be joined may be braid screens or solid foils or a combination of braid and solid foil. They may be of aluminium, copper, tin coated copper, silver coated copper, zinc coated steel, tin coated steel, silver, or another metal or alloy.

If the connection is made by means of a bridging strap the bridging strap may be a strip or sleeve of braid or of solid metal, usually in foil form. It may be Al, Cu or Cu coated with Sn or Ag, Fe coated with Zn, Sn or Ag or another metal or alloy. It will not need cleaning before the welding operation and indeed may be coated with many non-metallic coatings without preventing the formation of strong metal-metal bonds with good conductive properties.

When a bridging strap is used it may be placed over, under or between the outer conductors of the cables.

The welds may be spot, seam or butt welds in any appropriate direction, e.g. longitudinal or circumferential.

Where overlap or butt welds are made there may be additionally present a brazing or soldering material which in the case of a butt weld is placed beneath the abutted edges and which will flow between the butted edges during the welding process without appreciable damage to the inner insulating material.

The process is characterised by placing the elements to be welded in contact and applying a high speed rotating frictional tool to the outer working surface opposite to the interfaces to be joined. This outermost working surface may be of a material to be welded or may be of an intervening material placed between the high speed tool and the outermost surface of the materials to be joined.

This is found, by a mechanism which is not understood, to generate instantaneously an extremely high energy level at the interface to form a weld.

In the case of similar metals, and whether the joint is an overlap or butt weld, the weld area may present a homogeneous crystal structure.

If dissimilar metals are comprised within the joint area considerable alloying and diffusion may occur. The joints created, however, are both mechanically strong and electrically sound with very low resistance values.

It would appear that the very high energy level generated at the interfaces is of such highly localised intensity and short duration that no heating of, or damage to, the elements or substrates surrounding or subjacent to the weld area occurs.

Joints need not comprise additional solder, brazing or filler materials of different composition and in the case of coated materials for example, thermoplastic coatings, the coating on at least one side of the foil or sheet remains substantially intact after the welding operation.

The actual joints per se and the products containing the joints of the invention therefore have novel characteristics.

BRIEF DESCRIPTION OF THE DRAWINGS

Examples of welds and products produced by the invention and the methods for carrying them out are shown in the accompanying drawings and photographs wherein:

FIG. 2 is a drawing depicting the ribbon cable welded to a circuit board through the cable insulation.

EXAMPLE 1

The welding of a polyimide film backed copper conductor flexible ribbon cable to copper conductors on printed circuit boards (Polyimide film 0.005 mm with 0.003 mm copper)

Figure 1:
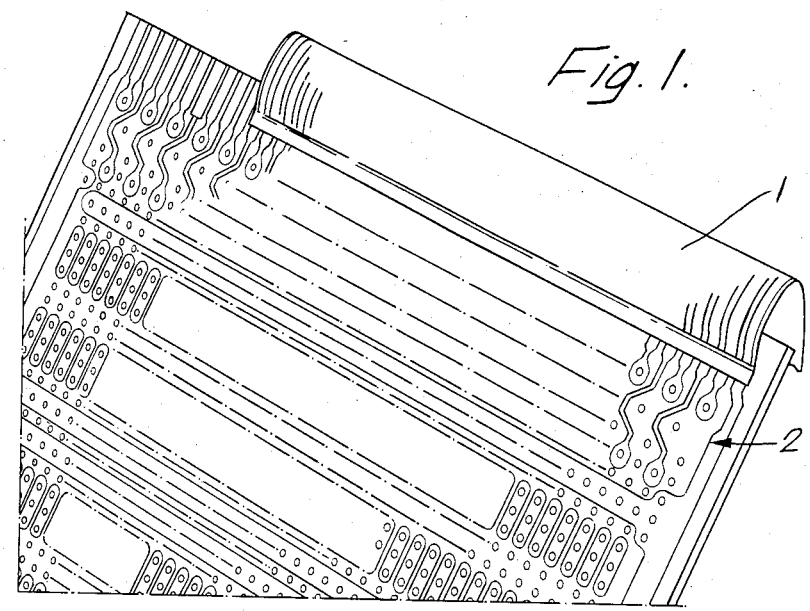
FIG. 1 is a reproduction of a photograph of a circuit board to both sides of which the copper conductors of a flexible ribbon cable have been welded.

The ribbon cable or flexible circuit 1 (FIGS. 1 and 2) is held in position above the printed circuit board 2 so that each copper track 3 on the Kapton (Trade Mark Du Pont de Nemours for a polyimide) is directly above and in contact with a terminal pad 4 on the printed circuit board. The ribbon cable and printed circuit board are clamped in this position onto a traverse table.

This traverse table is now set in motion at a linear speed of 85 mm per second along a track which carries it beneath a rotary tool fitted with a hardened steel wheel rotating at 35,000 rpm which contacts the surface of the Kapton insulation such that it passes over each copper track in turn, the direction of motion being at right angles to the conductor direction. The wheel has a 38 mm diameter and a contacting friction surface of 1 mm.

This causes the Kapton insulation immediately backing each copper track to be removed and a weld 5 is formed between the copper track and the corresponding copper terminal on the printed circuit board. Neither the copper conductor tracks on the Kapton nor the printed circuit board terminals need to have been cleaned and the weld produced is mechanically strong and electrically a very good contact. In addition to the materials mentioned, the terminals may be silver plated copper tin plated copper or copper with a variety of other metal coatings, including gold. The conductors of the flexible ribbon cable may for example be aluminium. The Kapton or other insulation of the cable may of course be stripped from the conductors before the welding process.

It can be seen that the method eliminates both mechanically fitted connections (which are a major site for failure) onto terminal pads of printed-circuit boards and the damage which may be caused to the board, especially to a flexible or multi-layer board, by the heat and fluxes used in soldering processes. Even if as may be the case a brazing or soldering metal is interposed between the conductors and the terminal pads, which may also be coated with such a metal, to be welded by the present process, no flux is involved.

If a disconnectable connection is required to link two circuit boards, a tail of flexible ribbon cable or a flexible circuit may be attached permanently to each by the present process, and a single mechanical disconnectable connection provided between the two flexible circuits or tails, thus cutting down the sites at which mechanical misconnections can occur.

EXAMPLE 2

Reflow soldering of electronic components by welding

Damage can be caused to electronic components through their overheating during soldering or reflow soldering operations when heat is applied either by a soldering iron or by placing the component in an oven. The use of the present process to spot or friction seam join these components, packages, carriers, carrier lids, connections or their peripherals, causes the solder to reflow very locally without heating the rest of the component. A strong joint or hermetic seal is also obtained in this manner.

In particular the present process may be used in the packaging of integrated circuits. In general these are hermetically packed in such a way as to exclude moisture and foreign bodies while providing robust external leads suitable for mounting the package onto a printed circuit board. A preferred arrangement for the external leads is of two rows of an equal number of pins which may be designed to pass through corresponding holes in the circuit on a printed circuit board or to rest with sections of their lengths on the corresponding terminals of a printed circuit. The body of the package may be of a ceramic material and the lid and external leads of such a package may be of a metal such as Kovar (Fe 54%, Ni 29%, Co 17%). Often the metal lid needs electrically interconnecting to any printed circuit on which the package may be mounted and this may be achieved by soldering the lid to a pre-deposited metal layer on the body of the package. Such integrated circuit packages are often called "chip carriers".

(a) The reflow soldering of a gold coated lid of Kovar metal to a gold coated ceramic silicon chip carrier with a deposited layer of solder on the chip carrier in the area in which the lid is to be secured The lid is secured to the chip carrier by adhesive tape leaving one side free to be welded. The carrier and lid are clamped in position on the traverse table. A highly polished hardened steel wheel 42 mm in diameter and 3.2 mm wide is positioned so that only one millimeter of the rim of the wheel contacts the outer edge of the chip carrier lid during the welding operation. The rotary tool is switched on with the rotary speed of the wheel pre-set at 20,000 rpm. The speed of the traverse table is set at 70 mm per second. When the table is set in motion the wheel contacts the rim of the lid instantly reflowing the solder to join the lid to the carrier. Each side of the lid is welded in turn to the carrier but the welding effect is localised to the area of contact of the wheel with the rim of the lid and is so fast that no bulk heating of the component occurs.

(b) The connecting by reflow soldering or tinning onto the leaded tin coated copper connector pads of a printed circuit board of the multiple connectors of a chip carrier or packaged electronic component The difficulties of either soldering or reflow soldering very fine closely spaced connectors to the connector pads of printed circuit boards is well-known. In this example the connector pads and connectors are 1 mm wide and spacing between them 0.20 mm. The component is clamped in position so that the connector pads and connectors match and a mask of intervening material is applied over the component to hold the pads and connectors firmly in place. This intervening material can be of polytetraflourethylene coated glass cloth or of paper, Kapton or another such material, and it intervenes between the friction wheel and the connectors serving both to hold them in position and to protect them. A rotary tool fitted with a hardened steel wheel 50 mm in diameter and with a working frictional surface of 1 mm rotating at a speed of 15,000 rpm is brought into light contact with the surface of the intervening material as the traverse table carrying the printed circuit board moves beneath it. This causes the leaded tin solder to reflow joining the connectors to the connecting pads. The intervening material is removed following the welding operation.

Numerous other electronic packages and components can be reflow soldered in this manner, thus creating a novel method of jointing closely packed components and producing a number of novel products.

EXAMPLE 3

Figure 3:
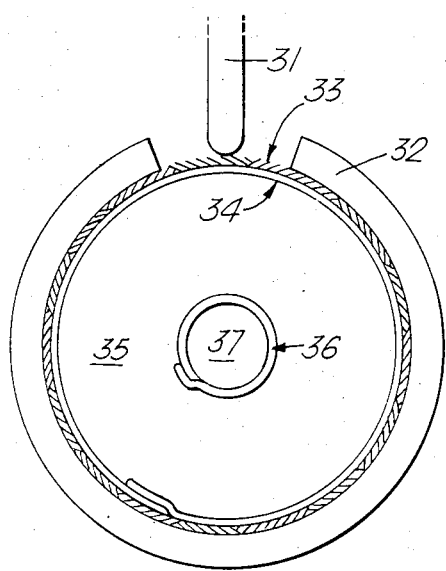
FIGS. 3 to 6 are schematic drawings of methods by which copper wire braid is welded to the outer conductor of a cable in-situ over the cable.

(a) The welding of a tin coated copped wire braid sleeve to the outer aluminium or copper conductor of a cable in situ over a cable core of 25.4 mm diameter In this example within the invention, the outer conductors on each side of an internal joint in a co-axial cable are connected by means of a copper wire braid. Prior to any jointing, a section of braid sleeve 33 (FIG. 3) of tin plated copper wire 0.19 mm diameter is fed over the end of one of the cables. In the present example the cable is submarine cable. After the respective inner reinforcements 37 and the respective inner conductors 36 have been joined, and the cable insulation 35 replaced, the sleeve 33 is pulled over the joint area so that it is contacting the outer conductor 34 of the cables on either side of the joint.

Using a split sleeve 32 the braid is circumferentially clamped firmly to one of the outer conductors 34 over an axial length of 100 mm such that the only exposed area of braid left in the clamped region is a narrow strip parallel to the cable axis. A rotary tool driving a 38 mm diameter hardened steel wheel 31 with an edge surface 1 mm wide is fixed on a movable arm such that the edge of the wheel contacts the braid in the area left clear by the split clamping sleeve, and such that the wheel may be traversed along the length of the clamped braid. The weld is made with the wheel driven at 35,000 rpm and traversed along the clear section of braid at 120 mm/sec.

Figure 6:
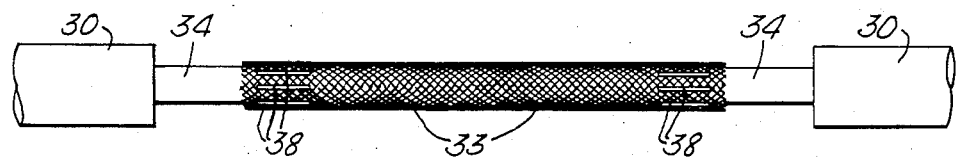

A series of such line welds 38, (FIG. 6) made around the perimeter of the cable result in a series of strong and flexible mechanical joints and good electrical connections between the braid and the outer conductor, without damage to the underlying cable insulation. A similar operation is carried out on the cable at the other side of the joint, and the outer insulating and protective sheathing 30 is replaced over the joint area.

This effect is impossible to achieve with any other process known to us, giving a novel and invention end product.

Figure 4:
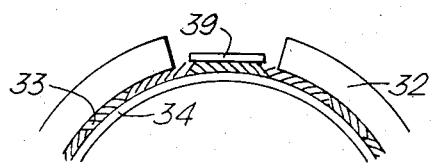

(b) The example is as 3a but as illustrated in FIG. 4 a piece of copper foil 39 0.10 mm thick, is placed between the wheel 31 and the wires of the copper braid 33. This foil can be broken off either side of the weld once the latter has been achieved.

Figure 5:
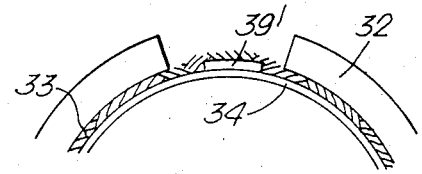

(c) The example is as 3a but as illustrated in FIG. 5 a strip of brazing material 39' such as silver alloy or tin is placed between the braid screening material 33 and the outer copper or aluminium conductor 34 of the cable to further strengthen the weld.

The expedients of Examples 3b and 3c can also be combined.

The whole area may then be re-sheathed or encapsulated.

Figure 7:
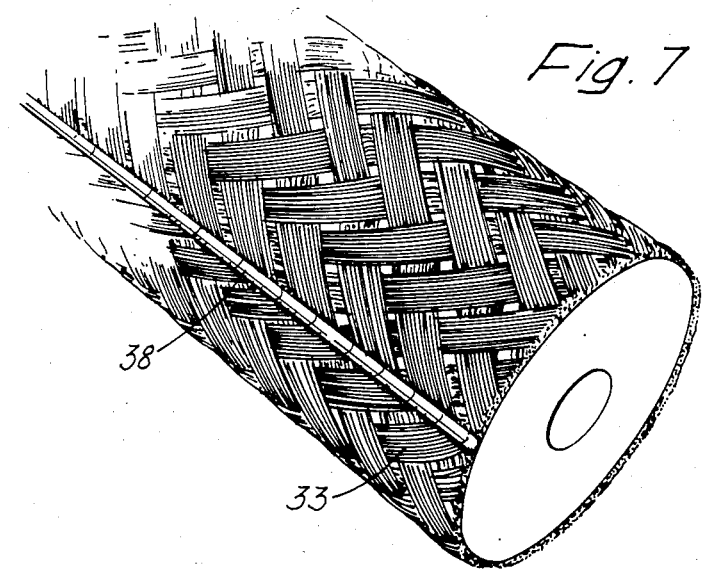
FIG. 7 shows a portion of submarine cable showing a weld in which the tinned copper wire braid has been welded to the aluminium outer conductor sheathing of the cable.

FIG. 7 shows a photograph of the braid 33 and a weld line 38.

Figure 8A:
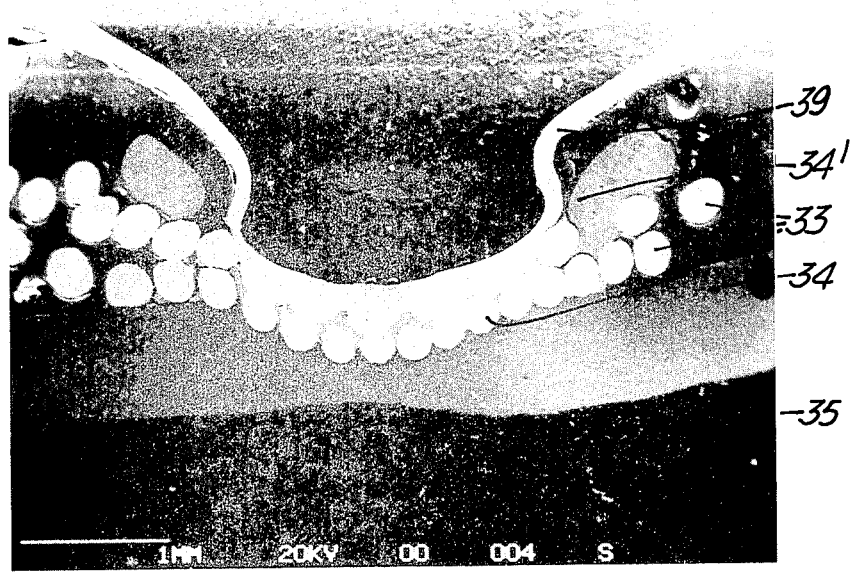
FIGS. 8a and b are reproductions of photomicrographs of a cross-section of the weld seen in FIG. 3 at magnifications of 20× and 100× respectively.
Figure 8B:
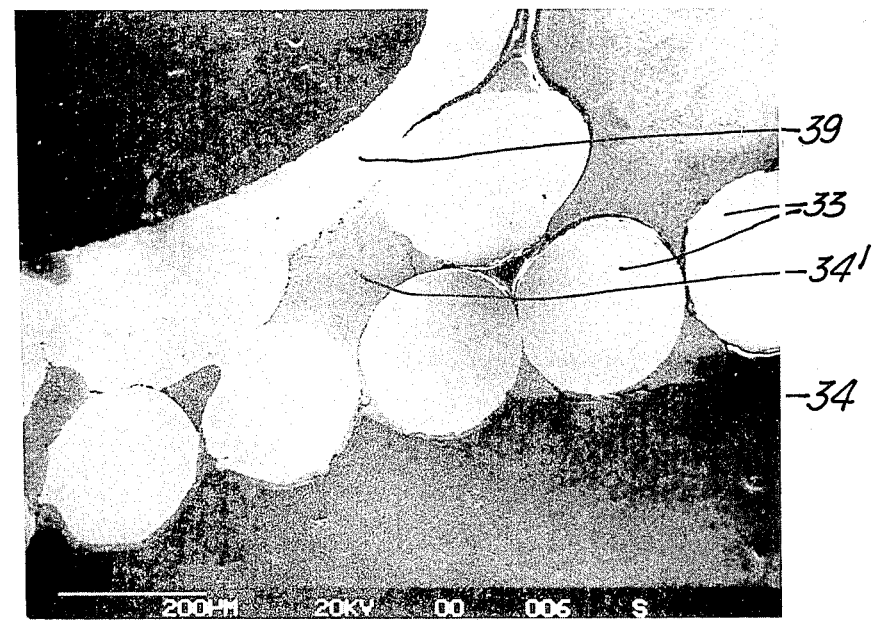

FIGS. 8a and 8b show the effects of carrying out a process as described with reference to Example 3b and FIG. 4, where the outer conductor is of aluminium.

The copper foil 39 is shown welded to the wires of the braid 33, while the aluminium from the outer conductor 34 has alloyed with the copper and has flowed through the wires at, for example, 34', but there has been no damage to the insulator 35.

Figure 9A:
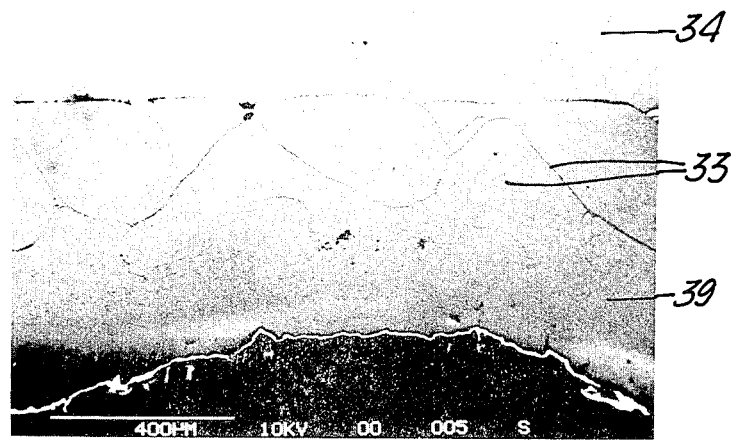
FIGS. 9a and b are reproductions of photomicrographs at 75× and 200× respectively of a similar weld of wire braid to a copper conductor 0.30 mm thick.
Figure 9B:
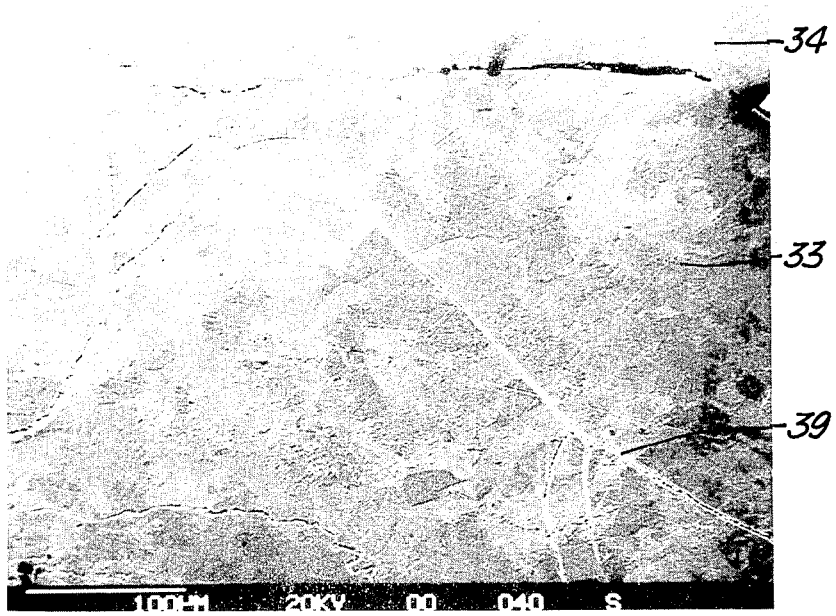

FIGS. 9a and 9b show the effects of the process as described with reference to Example 3b and FIG. 4. Copper braid 33 is seen to be securely welded through a copper foil intervening layer 39 to a copper outer conductor 34.

What is claimed is:

1. An electrical assembly including a first electrical or electronic component with a first plurality of conductors disposed in a first linear array and further including a second electrical or electronic component with a second plurality of conductors disposed in a second linear array, the conductors of said first linear array being aligned with and bonded to respective conductors of said second linear array, the bonding between the conductors being achieved by a friction bonding process wherein a rotating friction wheel in contact with an outer surface of one of said first and said second component is translated along a linear path to bond the conductors of said first array one after the other to the respective conductors of said second array, the conductors of said first array being in contact with the respective conductors of said second array during the translation of said friction wheel, the bonds between the conductors of said first array and the respective conductors of said second array being permanent conductive metallurgical bonds.

2. An electrical assembly of at least two components having predetermined forms and including an end portion of an outer conductor of an electrical cable and a cable jointing element bonded to one another, a surface of one of said components extending along the length thereof overlapping a surface of the other of said components extending along the length thereof, said cable jointing element being bonded to said outer conductor along the overlapping surfaces of said components by a friction bonding process wherein a relative rubbing movement is produced between a rotating friction wheel and an outer surface of one of said components facing away from an interface between said components while substantially maintaining the predetermined forms of said components, whereby a permanent conductive metallurgical bond is formed between said components.

3. An assembly according to claim 1 wherein at least one of the conductors of said first array is bonded to a corresponding conductor of said second array through a brazing or soldering interlayer formed by reflow soldering of a brazing or soldering material previously deposited on one of the conductors bonded to one another through said interlayer, the reflow soldering being achieved by the friction bonding process.

4. An assembly according to claim 2 wherein said cable jointing element is bonded to said outer conductor through a brazing or soldering interlayer formed by reflow soldering of a brazing or soldering material previously deposited on one of said cable jointing element and said outer conductor, the reflow soldering being achieved by the friction bonding process.

5. An assembly according to claim 1 wherein one of said first and said second component is a printed circuit board and the other of said first and said second component is a chip or chip carrier.

6. An assembly according to claim 1 wherein one of said first and said second component is a printed circuit board and the other of said first and said second component is a flexible conductor strip.

7. An assembly according to claim 6, wherein the printed circuit board has an array of terminal pads adjacent an edge and the flexible conductor strip has a registering array of conductors, said array of terminal pads constituting said first linear array and said registering array of conductors constituting said second linear array, the bonds between respective pads and conductors of the registering array being formed by a single pass of the wheel across the registering array.

8. An assembly according to claim 5, claim 6 or claim 7, wherein the bonding is achieved through a brazing or soldering interlayer.

9. A method of manufacturing an electrical assembly including a first electrical or electronic component with a first plurality of conductors disposed in a first linear array and further including a second electrical or electronic component with a second plurality of conductors disposed in a second linear array, the conductors of said first linear array being aligned with and bonded to respective conductors of said second linear array, said method comprising the steps of:
 positioning said first and said second component with respect to one another so that the conductors of said first array are in contact with respective conductors of said second array;
 placing a rotating friction wheel in contact with an outer surface of one of said first and said second component;
 translating said rotating friction wheel along a linear path while maintaining said rotating friction wheel in contact with said outer surface of said one of said first and said second component to bond the conductors of said first array one after the other to the respective conductors of said second array; and
 holding the conductors of said first array in contact with the respective conductors of said second array during the translation of said friction wheel, the bonds between the conductors of said first array and the respective conductors of said second array being permanent conductive metallurgical bonds formed by a friction bonding process.

10. A method according to claim 9 wherein one of said components is a printed circuit board and the other of said components is a chip or chip carrier.

11. A method according to claim 10 wherein the printed circuit board has an array of terminal pads adjacent an edge and the chip or chip carrier has a registering array of connectors, the bonds between respective pads of the printed circuit board and the connectors of the chip or chip carrier being formed by a single pass of the wheel along a substantially linear path.

12. A method according to claim 9 wherein one said components is a printed circuit board and the other of said components is a flexible conductor strip.

13. A method according to claim 12 wherein the printed circuit board has an array of terminal pads adjacent an edge and the flexible conductor strip has a registering array of conductors, the bonds between respective pads and conductors of the registering array being formed by a single pass of the wheel across the registering array.

14. A method of manufacturing an electrical assembly of at least two components having predetermined forms and including an end portion of an outer conductor of an electrical cable and a cable jointing element bonded to one another, said method comprising the steps of:
 placing the end portion of the outer conductor of the electrical cable and the cable jointing element into contact with one another so that a surface of one of the components extending along the length thereof overlaps a surface of the other of said components extending along the length thereof; and
 placing a rotating friction wheel into contact with an outer surface of one of said components facing away from an interface between said components while maintaining contact between said cable jointing element and said outer conductor and while substantially maintaining the predetermined forms of said components to bond said cable jointing element to said outer conductor along the overlapping surfaces of said components by a friction bonding process wherein a relative rubbing movement is produced between the rotating friction wheel and said outer surface of said cable jointing element, whereby a permanent conductive metallurgical bond is formed between said outer conductor and said cable jointing element.

15. An electrical assembly of at least two components including an end portion of an outer conductor of an electrical cable and a cable jointing element bonded to one another, said cable jointing element being a wire braid sleeve fitted over the end portion of said outer conductor, said wire braid sleeve being bonded to said outer conductor by a friction bonding process wherein a relative rubbing movement is produced between a rotating friction wheel and an outer surface of one of said components facing away from an interface between said components, whereby a permanent conductive metallurgical bond is formed between said components without substantial distortion of said components.

16. An assembly according to claim 2 or claim 15, wherein solid metal is additionally bonded to a least one of the outer conductor and the cable jointing element.

17. As assembly including a pair of electrical or electronic components provided respectively with a first conductor and a second conductor, one of said components being a printed circuit board and the other of said components being a chip or chip carrier, said first conductor being bonded to said second conductor through a brazing or soldering interlayer formed by reflow soldering of a brazing or soldering material previously deposited on one of said first and said second conductor, the reflow soldering and the bonding between the conductors being achieved by a friction bonding process wherein a relative rubbing movement is produced between a rotating friction wheel and an outer surface of one of said components facing away from the brazing or soldering material at an interface between said components, whereby a permanent metallurgical bond is formed between said components through said brazing or soldering interlayer without substantial distortion of said components.

18. An assembly according to claim 17 wherein the printed circuit board has an array of terminal pads adjacent an edge and the chip or chip carrier has a registering array of connectors, the bonds between respective pads of the printed circuit board and the connectors of the chip or chip carrier being formed by a single pass of the wheel along a substantially linear path.

19. An assembly including a pair of components provided respectively with a first metallic element and a second metallic element, one of said components being a chip carrier and the other of said components being a chip carrier lid, said first metallic element being bonded to said second metallic element through a brazing or soldering interlayer formed by reflow soldering of a brazing or soldering material previously deposited on one of said first and said second metallic element, the reflow soldering and the bonding between the metallic elements being achieved by a friction bonding process wherein a relative rubbing movement is produced between a rotating friction wheel and an outer surface of one of said components facing away from the brazing or soldering material at an interface between said components, whereby a permanent metallurgical bond is formed between said components through said brazing or soldering interlayer without substantial distortion of said components.

* * * * *